United States Patent
Niwa et al.

(10) Patent No.: US 9,208,011 B2
(45) Date of Patent: Dec. 8, 2015

(54) SYNCHRONOUS SERIAL INTERFACE CIRCUIT AND MOTION CONTROL FUNCTION MODULE

(71) Applicant: OMRON Corporation, Kyoto-shi, Kyoto (JP)

(72) Inventors: Yoshimi Niwa, Kusatsu (JP); Katsuyuki Kawamata, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 123 days.

(21) Appl. No.: 14/196,238

(22) Filed: Mar. 4, 2014

(65) Prior Publication Data
US 2014/0289571 A1 Sep. 25, 2014

(30) Foreign Application Priority Data
Mar. 25, 2013 (JP) .................. 2013-061798

(51) Int. Cl.
*G06F 11/00* (2006.01)
*G06F 11/07* (2006.01)
*G01D 3/08* (2006.01)
*H03M 1/08* (2006.01)
*H03M 1/26* (2006.01)

(52) U.S. Cl.
CPC ............. *G06F 11/076* (2013.01); *G01D 3/08* (2013.01); *H03M 1/08* (2013.01); *H03M 1/26* (2013.01)

(58) Field of Classification Search
CPC ................................ H03M 1/08; H03M 1/26
USPC .......... 714/47.2, 47.1, 47.3, 48, 46, 707, 719, 714/731
See application file for complete search history.

(56) References Cited

U.S. PATENT DOCUMENTS

| | | | | |
|---|---|---|---|---|
| 7,128,270 B2 * | 10/2006 | Silverbrook | .......... | G06F 3/0317 235/462.45 |
| 9,118,457 B2 * | 8/2015 | Sengoku | .................. | H04L 7/027 1/1 |
| 2002/0184568 A1 * | 12/2002 | Kurrasch | ............ | G06F 11/0748 714/39 |
| 2004/0190092 A1 * | 9/2004 | Silverbrook | .......... | G06F 3/0317 358/539 |
| 2007/0260939 A1 * | 11/2007 | Kammann | .......... | G06F 11/0739 714/48 |

FOREIGN PATENT DOCUMENTS

JP H05-063754 A 3/1993

* cited by examiner

*Primary Examiner* — Dieu-Minh Le
(74) *Attorney, Agent, or Firm* — Marvin A. Motsenbocker; Mots Law, PLLC

(57) ABSTRACT

A clock output unit outputs a synchronous clock signal. A serial data receiving unit receives data representing an absolute position and an encoder sends data in synchronization with the synchronous clock signal. A position conversion unit converts the received absolute position into a current position. The position conversion unit calculates a difference between a last received absolute position and an absolute position received immediately before the last received absolute position. The position conversion unit obtains the latest current position by adding the difference and a current position that was calculated immediately before the latest current position. If the absolute value of the calculated difference is greater than a threshold value, the position conversion unit determines that the last received absolute position has an error.

8 Claims, 8 Drawing Sheets

SYNCHRONOUS SERIAL INTERFACE CIRCUIT AND MOTION CONTROL FUNCTION MODULE

FIELD

The invention relates to a synchronous serial interface circuit and a motion control function module, and particularly relates to a synchronous serial interface circuit that receives serial data containing absolute position information from an encoder and a motion control function module that includes such a synchronous serial interface circuit.

BACKGROUND

Synchronous serial communication is serial communication wherein data is sent or received in synchronization with a clock. A synchronous serial interface (hereinafter abbreviated to "SSI") is widely used as a standard interface between a master and a slave for industrial applications.

For example, JP H5-63754A discloses a signal transmitter that serially transmits an NRZ (Non Return to Zero) signal stream from a transmitting circuit to a receiving circuit in synchronization with a clock signal stream. This signal transmitter executes horizontal and vertical parity checks. The signal transmitter further generates a signal that indicates detection of a header, a reception error signal, or a reception end signal.

JP H5-63754A is an example of background art.

However, conventionally, as disclosed in JP H5-63754A, bit inversion or the like caused by external noise or the like has only been dealt with by parity checks. Therefore, cases where there is a significant change in the data, such as a change in multiple bits caused by external noise, conventionally could not be dealt with.

To address this issue, it is conceivable to allow the synchronous serial interface to perform transmission using a more sophisticated protocol and impart data checking functionality, such as an FCS (Frame Check Sequence), to the synchronous serial interface. However, this approach requires high-speed bidirectional communication and results in an increase in device cost.

SUMMARY

Thus, one object of embodiments is to provide a synchronous serial interface circuit that is capable of anomaly avoidance processing without using an expensive communication means and without increasing a computation load of a host device, and a motion control function module including such a synchronous serial interface circuit.

To address the above-described problem, a synchronous serial interface circuit in one embodiment includes a clock output unit that outputs a synchronous clock, a receiving unit that receives data representing an absolute position of an encoder, the data being sent from the encoder in synchronization with the synchronous clock, and a position conversion unit that converts the absolute position represented by the received data into a current position of the encoder. The position conversion unit calculates a difference between a most recently received absolute position and an absolute position that is received one point in time before the most recently received absolute position, and obtains a latest current position by adding the difference and a current position that is calculated one point in time before the latest current position. If an absolute value of the calculated difference is greater than a threshold value, the position conversion unit determines that there is an error in the most recently received absolute position.

Preferably, if the position conversion unit determines that there is an error in the most recently received absolute position, the position conversion unit considers the position of one point in time before the latest current position as the latest current position.

Preferably, if the position conversion unit determines that there is an error in the most recently received absolute position, the position conversion unit obtains the latest current position by adding a difference that is calculated one point in time before and the current position that is calculated one point in time before.

Preferably, if the position conversion unit determines that there is an error in the most recently received absolute position, the position conversion unit stops conversion of the absolute position into the current position.

Preferably, the encoder is a rotary encoder. If an absolute value of a subtracted value obtained by subtracting the absolute position that is received one point in time before the most recently received absolute position from the most recently received absolute position is less than or equal to 180 degrees, the position conversion unit uses the subtracted value as the difference. If the subtracted value is greater than 180 degrees, a value obtained by subtracting 360 degrees from the subtracted value is set as the difference, and if the subtracted value is smaller than −180 degrees, a value obtained by adding 360 degrees to the subtracted value is used as the difference.

A motion control function module of embodiments includes the above-described synchronous serial interface circuit and a communication unit that sends the latest current position calculated and a result of the error determination to an external controller at predetermined intervals.

Preferably, the communication unit receives data representing the threshold value from the external controller. The position conversion unit determines whether the most recently absolute position has an error, based on the received threshold value.

Preferably, the motion control function module includes a nonvolatile memory that stores the threshold value. When power to the motion control function module is turned on or when the motion control function module is restarted, the position conversion unit reads the threshold value from the nonvolatile memory. This unit determines whether the most recently received absolute position has an error, based on the read threshold value.

According to embodiments it is possible to realize SSI communication over a plurality of channels with a small number of communication function modules without increasing a data update interval of each channel.

DETAILED DESCRIPTION

Figure 1:
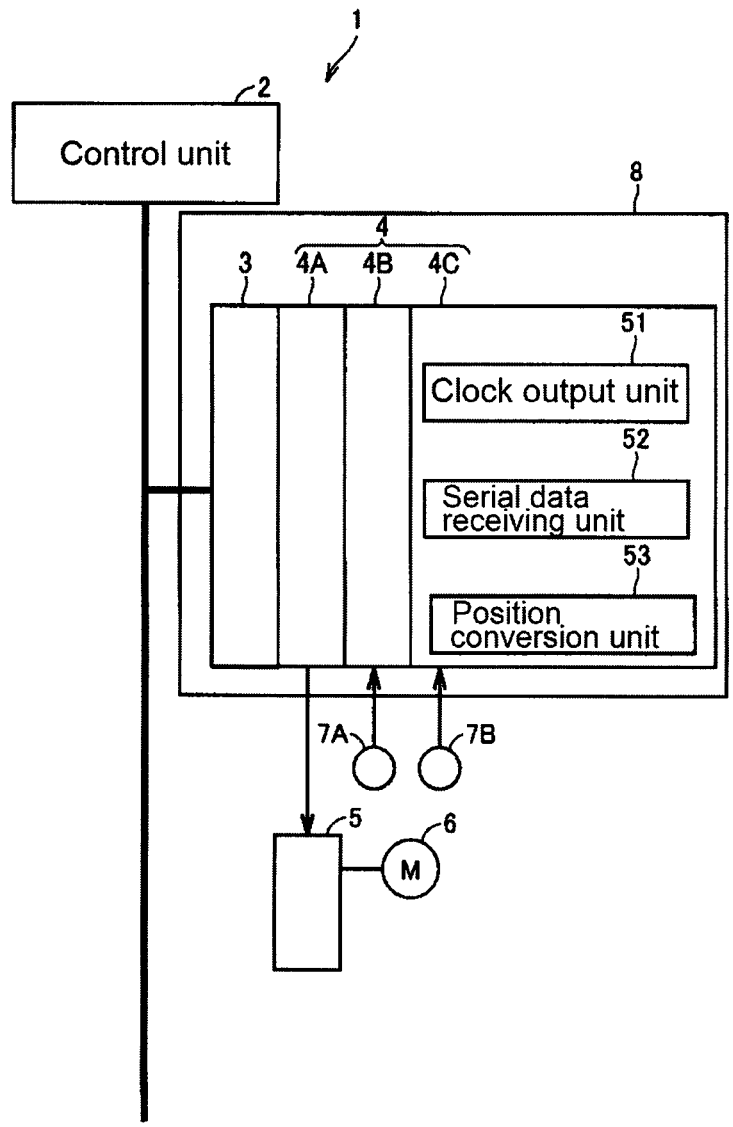
FIG. 1 is a block diagram that schematically shows a motion control system with an interface circuit according to an embodiment of the invention.

Hereinafter, embodiments will be described in detail with reference to the drawings. The following description denotes like components by like reference numerals, and does not repeat detailed descriptions.

Example One

FIG. 1 is a block diagram schematically showing the configuration of a motion control system including an interface circuit according to an embodiment of the invention.

Referring to FIG. 1, a motion control system 1 includes a control unit 2, a motion control function module 8, a motor driver 5, a motor 6, an encoder 7A, and an encoder 7B. The motion control function module 8 includes a communication unit 3 and a position interface unit 4.

Rotary encoders 7A and 7B detect rotation of the motor 6. Encoder 7B outputs an absolute position (rotation angle).

Communication unit 3 connects to control unit 2 via a network such as a LAN (Local Area Network). For example, communication unit 3 may be configured to communicate with control unit 2 using EtherCAT (registered trademark) or the like.

Control unit 2 performs positioning control or motion control of motor driver 5 in cooperation with position interface unit 4. Control unit 2 may be configured by, for example, a PLC (Programmable Logic Controller).

Position interface unit 4 has a function of input/output processing of position data for positioning control. Position interface unit 4 connects to communication unit 3 and periodically communicates with control unit 2 via communication unit 3 and the network.

Position interface unit 4 sends count values of encoders 7A and 7B or values into which the count values were converted to control unit 2. Control unit 2 sends control data containing a position command or a speed command to position interface unit 4.

Position interface unit 4 includes pulse output unit 4A, pulse input unit 4B, and SSI input unit 4C.

Control unit 2 executes motion computation at regular intervals and generates a command value to send to pulse output unit 4A. The command value is sent to the pulse output unit 4A at predetermined communication intervals. Pulse output unit 4A generates pulses, the number and the frequency of the pulses being determined by the command value, and outputs the pulses to motor driver 5. Motor driver 5 drives motor 6 according to pulses from pulse output unit 4A.

Pulse input unit 4B receives pulses output by encoder 7A and counts those pulses.

In this embodiment, SSI input unit 4C functions as a master unit, and encoder 7B functions as a slave unit.

As shown in FIG. 1, SSI input unit 4C includes clock output unit 51, serial data receiving unit 52, and position conversion unit 53.

Figure 2:
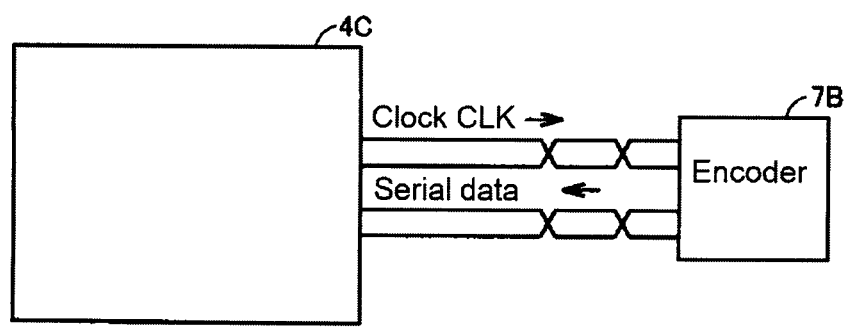
FIG. 2 is a diagram for explaining a synchronous clock and serial data.

FIG. 2 diagrammatically shows a synchronous clock and serial data.

Referring to FIG. 2, clock output unit 51 of the SSI input unit 4C sends a synchronous clock CLK to encoder 7B. Encoder 7B sends serial data to SSI input unit 4C in synchronization with the synchronous clock CLK. Serial data receiving unit 52 of SSI input unit 4C receives the serial data.

Figure 3:
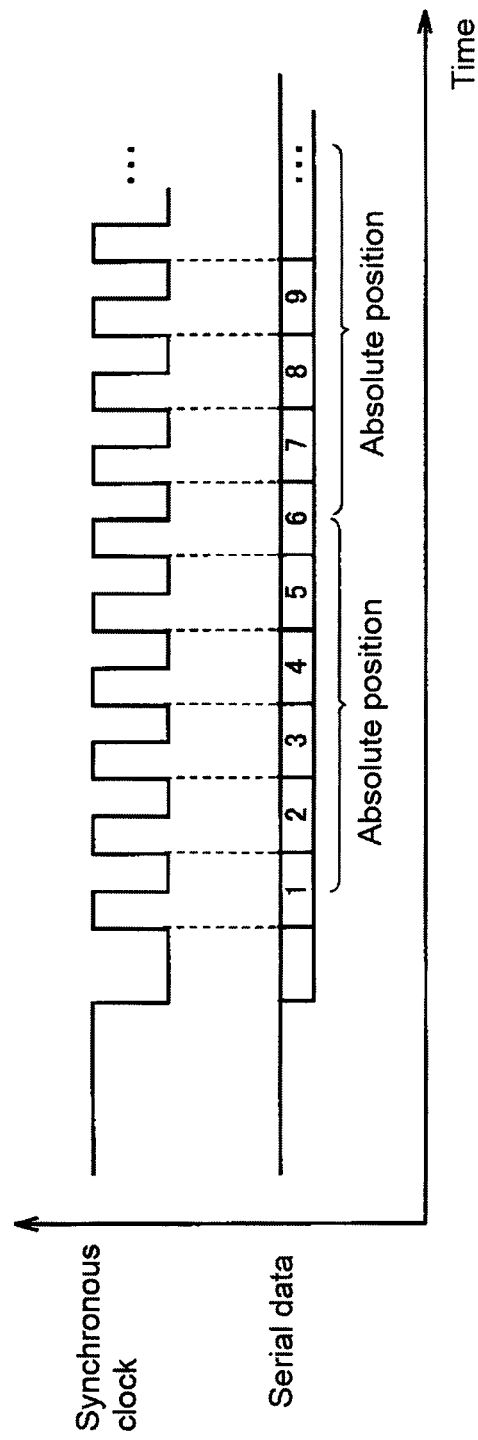
FIG. 3 is a timing diagram of the synchronous clock CLK and the serial data.

FIG. 3 is a timing diagram of the synchronous clock CLK and the serial data. Encoder 7B sets and outputs data of each bit at the rising edges of the synchronous clock CLK. The absolute position of encoder 7B is represented by 5-bit data output from the encoder 7B. Serial data receiving unit 52 reads out the set data of each bit at the falling edges of the synchronous clock CLK.

Position conversion unit 53 converts an absolute position of encoder 7B that is represented by the received serial data into a current position of encoder 7B. Hereinafter this conversion is referred to as "current position conversion." Position conversion unit 53 calculates a difference between a most recently received absolute position and an absolute position received one point in time before the most recently received absolute position. Position conversion unit 53 obtains the latest (i.e. newest) current position by adding the difference to a current position that was calculated one point in time before the latest current position.

Also, position conversion unit 53 determines whether the received absolute position has an error, and sets the status to "error" if an error is present. Data representing the current position converted by position conversion unit 53 and the status information are sent to the control unit 2 at predetermined communication intervals via communication unit 3 and the network.

Figure 4:
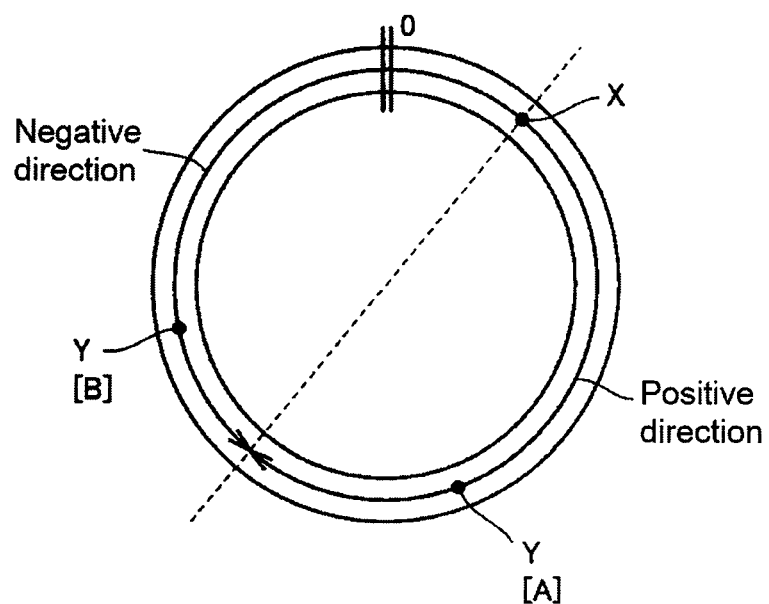
FIG. 4 is a diagram for explaining a method for calculating a difference between absolute positions.

FIG. 4 is a diagram for explaining a method for calculating a difference between absolute positions. The absolute position sent from encoder 7B is a value of at least 0° and less than 360°. Position conversion unit 53 calculates a difference such that a subtracted value (Y−X) obtained by subtracting an absolute position (rotation angle) X that was received one point in time before the most recently received absolute position (rotation angle) Y from the most recently received absolute position (rotation angle) Y is in the range between −180° and 180° inclusive.

As indicated by [A] in FIG. 4, if the subtracted value (Y−X), which is obtained by subtracting the absolute position X° that was received one point in time before the most recently received absolute position Y° from the most recently received absolute position Y°, is in the range between −180° and 180° inclusive, the position conversion unit 53 uses the subtracted value (Y−X) as the difference.

As indicated by [B] in FIG. 4, if the subtracted value (Y−X), which is obtained by subtracting the absolute position X° that was received one point in time before the most recently received absolute position Y° from the most recently received absolute position Y°, is greater than 180°, the position conversion unit 53 uses (Y−X)−360° as the difference.

If the subtracted value (Y−X), which is obtained by subtracting the absolute position X° that was received one point in time before the most recently received absolute position Y° from the most recently received absolute position Y°, is smaller than −180°, then (Y−X)+360° is used as the difference.

Figure 5A:
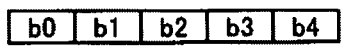
FIG. 5A illustrates data on an absolute position of an encoder 7B, These data are within serial data sent from the encoder 7B to an SSI input unit 4C.
Figure 5B:
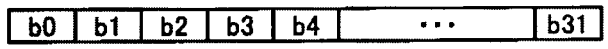
FIG. 5B illustrates data for a current position of encoder 7B that SSI input unit 4C outputs to control unit 2.

FIG. 5A is a diagram illustrating data on an absolute position of the encoder 7B that is contained in the serial data sent from the encoder 7B to the SSI input unit 4C. FIG. 5B is a diagram illustrating data on a current position of the encoder 7B that is output from the SSI input unit 4C to the control unit 2.

As illustrated in FIGS. 5A and 5B, absolute position data is 5-bit data. The absolute position represents a rotation angle of at least 0° and less than 360°.

Current position data is 32-bit data. The current position represents a rotation angle of at least −360°×k and less than 360°×k, where "k" is a natural number of 2 or more. Accordingly, while the absolute position can only represent the position of the encoder 7B within the range of one rotation in a positive direction, the current position can represent the position of the encoder 7B within the range of "k" rotations in the positive direction and a negative direction.

Current Position Conversion Operation

Figure 6:
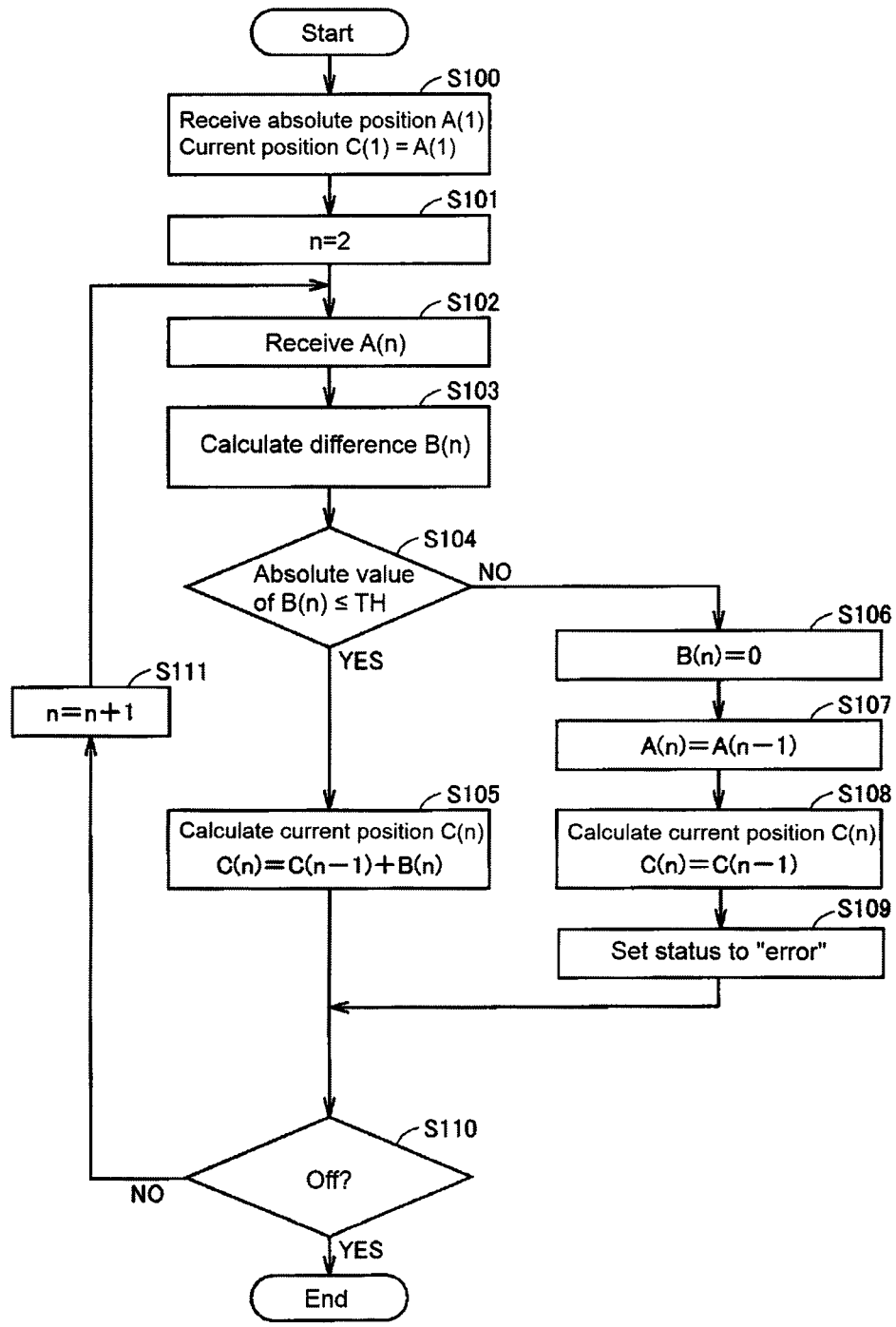
FIG. 6 is a flowchart illustrating a procedure for current position conversion according to example one.

FIG. 6 is a flowchart illustrating a procedure for current position conversion according to the example one.

Referring to FIG. 6, the serial data receiving unit 52 receives serial data sent from encoder 7B. An absolute position of encoder 7B that is represented by the first serial data received is denoted by A(1). Position conversion unit 53 sets the value of the received absolute position A(1) as the value of a current position C(1) (step S100).

Next, "n" is set to 2 (step S101). Then, serial data receiving unit 52 receives serial data sent from encoder 7B. An absolute position of encoder 7B that is represented by the received serial data is denoted by A(n) (step S102).

Position conversion unit 53 calculates the latest difference B(n) on the basis of the most recently received absolute position A(n) and the absolute position A(n−1) that was received one point in time before the most recently received absolute position A(n) using the method described above with reference to FIG. 4 (step S103).

If the absolute value of the difference B(n) is less than or equal to a threshold value TH (YES in step S104), then position conversion unit 53 calculates the latest current position C(n) by adding the difference B(n) to the current position C(n−1) that was calculated one point in time before the latest current position C(n) (step S105).

If the absolute value of the difference B(n) is greater than the threshold value TH (NO in step S104), then position conversion unit 53 sets the value of the latest difference B(n) to "0" (step S106), and sets the value of the most recently received absolute position A(n) to the same value as the absolute position A(n−1) that was received one point in time before the most recently received absolute position A(n) (step S107). Furthermore, position conversion unit 53 sets the latest current position C(n) to the same value as the current position C(n−1) that was calculated one point in time before the latest current position C(n) (step S108). Position conversion unit 53 sets the status to "error" (step S109).

Until the power is turned off (YES in step S110), the value of "n" is incremented (step S111), and the processing from step S102 onward is repeated.

Example One

Current Position Conversion

Figure 7:
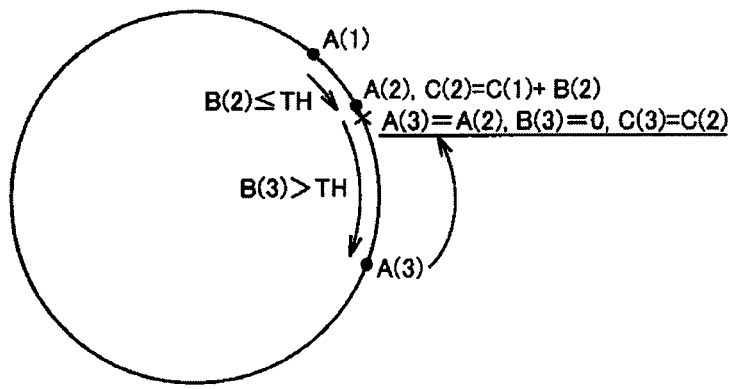
FIG. 7 is a diagram illustrating an example of current position conversion according to the example one.

FIG. 7 is a diagram illustrating current position conversion according to the example one.

The value of the difference B(2) between the absolute position A(2) and the absolute position A(1) is less than or equal to the threshold value TH, and thus the current position C(2) is the sum of the current position C(1) and the difference B(2).

On the other hand, the value of the difference B(3) between the absolute position A(3) and the absolute position A(2) is greater than the threshold value TH, and thus the value of the current position C(3) is the same as the value of the current position C(2), the value of the absolute position A(3) is corrected to the value of the absolute position A(2), and the value of the difference B(3) is set to "0".

Communication with Control Unit 2

Figure 8:
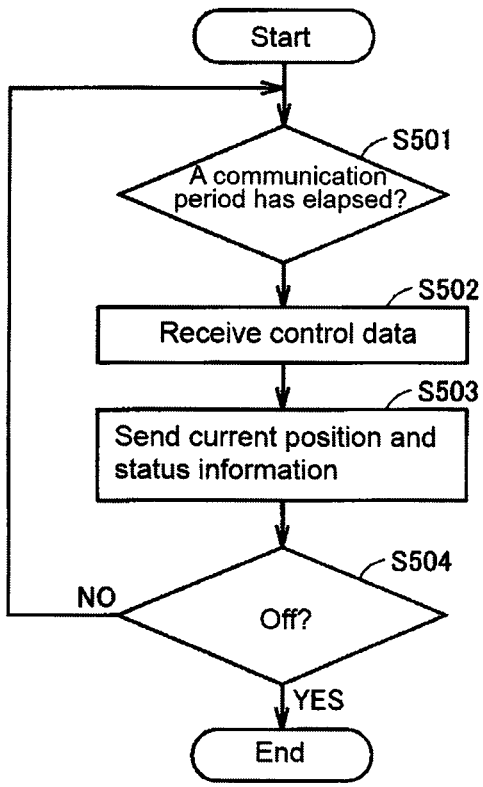
FIG. 8 is a flowchart illustrating a procedure for communication of a communication unit 3.

FIG. 8 is a flowchart illustrating a procedure for communications of communication unit 3.

In each communication period (YES in step S501), control unit 2 ends control data to be sent to the SSI input unit 4C, and communication unit 3 receives and sends this control data to the SSI input unit 4C (step S502). The control data may contain the threshold value TH for comparison with a difference between absolute positions. If the control data contains the threshold value TH, the position conversion unit 53 of the SSI input unit 4C executes the determination of step S104 using the received threshold value TH.

Also, the position conversion unit 53 of SSI input unit 4C supplies data representing the latest current position calculated and data representing the status to the communication unit 3, and the communication unit 3 sends the supplied data to the control unit 2. If the status is set to "error" in step S109, "error" is sent as the status.

The processing from step S501 onward is repeated until power is turned off (YES in step S504).

As described above, according to this embodiment, if there is a significant difference between the absolute position that was most recently received from the encoder 7B and the absolute position that was received the last time before the most recently received absolute position, it is determined that the most recently received absolute position contains an error, and anomaly avoidance processing is performed. Thus, the need for a high-speed communication means is eliminated, and the computation load of a host device can be reduced.

Example Two

The second example differs from the first example in the processing that the position conversion unit 53 performs if the difference B(n) is greater than the threshold value TH.

Current Position Conversion Operation

Figure 9:
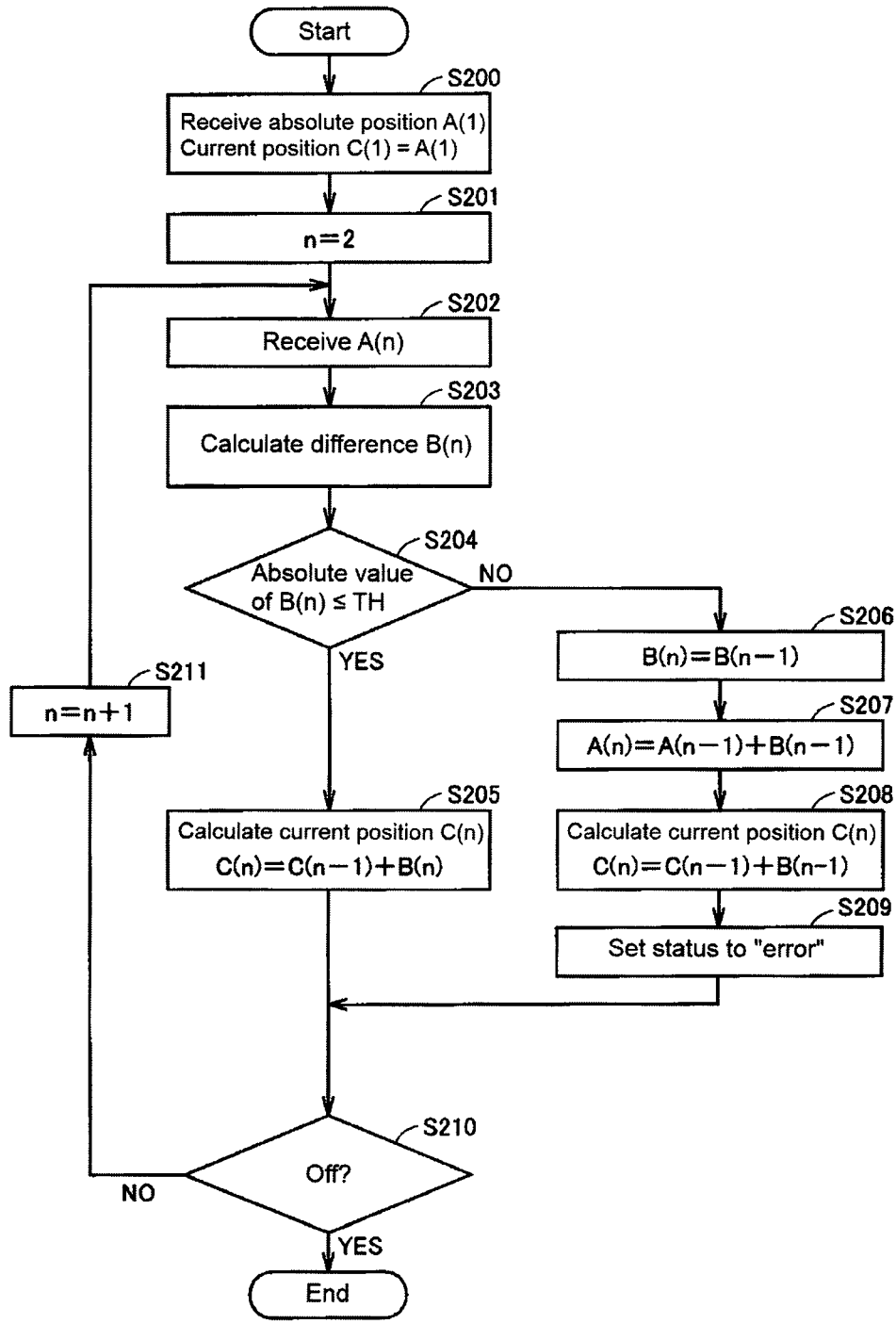
FIG. 9 is a flowchart illustrating a procedure for current position conversion according to example two.

FIG. 9 is a flowchart illustrating a procedure for current position conversion according to the example two.

Referring to FIG. 9, the serial data receiving unit 52 receives serial data sent from the encoder 7B. An absolute position of the encoder 7B that is represented by the first serial data received is denoted by A(1). The position conversion unit 53 sets the value of the received absolute position A(1) as the value of a current position C(1) (step S200).

Next, "n" is set to 2 (step S201). Then, the serial data receiving unit 52 receives serial data sent from the encoder 7B. An absolute position of the encoder 7B that is represented by the received serial data is denoted by A(n) (step S202).

The position conversion unit 53 calculates the latest difference B(n) on the basis of the most recently received absolute position A(n) and the absolute position A(n−1) that was received one point in time before the most recently received absolute position A(n) using the method described above with reference to FIG. 4 (step S203).

If the absolute value of the difference B(n) is less than or equal to the threshold value TH (YES in step S204), then position conversion unit 53 calculates the latest current position C(n) by adding the difference B(n) to the current position C(n−1) that was calculated one point in time before the latest current position C(n) (step S205).

If the absolute value of the difference B(n) is greater than the threshold value TH (NO in step S204), then position conversion unit 53 sets the value of the latest difference B(n) to the same value as the value of the difference B(n−1) that was calculated one point in time before the latest difference B(n) (step S206). Unit 53 also sets the value of the most recently received absolute position A(n) to the sum of the absolute position A(n−1) that was received one point in time before the most recently received absolute position A(n) and the difference B(n−1) that was calculated one point in time before the latest difference B(n) (step S207). Furthermore, position conversion unit 53 sets the latest current position C(n) to the sum of the current position C(n−1) that was calculated one point in time before the latest current position C(n) and the difference B(n−1) that was calculated one point in time before the latest difference B(n) (step S208). The position conversion unit 53 then sets the status to "error" (step S209).

Until power is turned off (YES in step S210), "n" is incremented (step S211), and processing repeats from step S202 onward.

Example of Current Position Conversion

Figure 10:
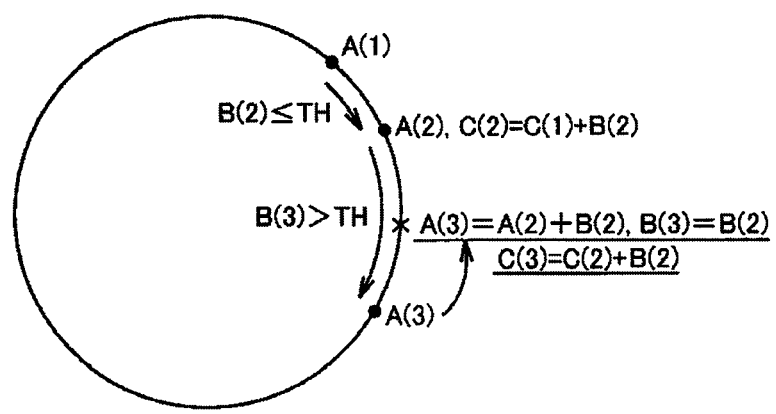
FIG. 10 is a diagram illustrating an example of current position conversion according to example two.

FIG. 10 is a diagram illustrating an example of current position conversion according to the example two.

The value of the difference B(2) between the absolute position A(2) and the absolute position A(1) is less than or equal to the threshold value TH. Thus the current position C(2) is the sum of the current position C(1) and the difference B(2).

On the other hand, the value of the difference B(3) between the absolute position A(3) and the absolute position A(2) is greater than the threshold value TH. Thus the value of the current position C(3) is the sum of the current position C(2) and the difference B(2). The value of the absolute position A(3) is corrected to the sum of the absolute position A(2) and the difference B(2), and the value of the difference B(3) is set to the same value as the difference B(2).

As described above, according to this embodiment, as in the example one, if the absolute position most recently received from the encoder 7B differs from the absolute position that was received the last time before the most recently received absolute position, then the most recently received absolute position contains an error, and anomaly avoidance processing is performed. This eliminates the need for a high-speed communication means and can reduce the computation load of the host device.

Example Three

The third example differs from the first and second examples in the processing that the position conversion unit 53 performs if the difference B(n) is greater than the threshold value TH.

Current Position Conversion Operation

Figure 11:
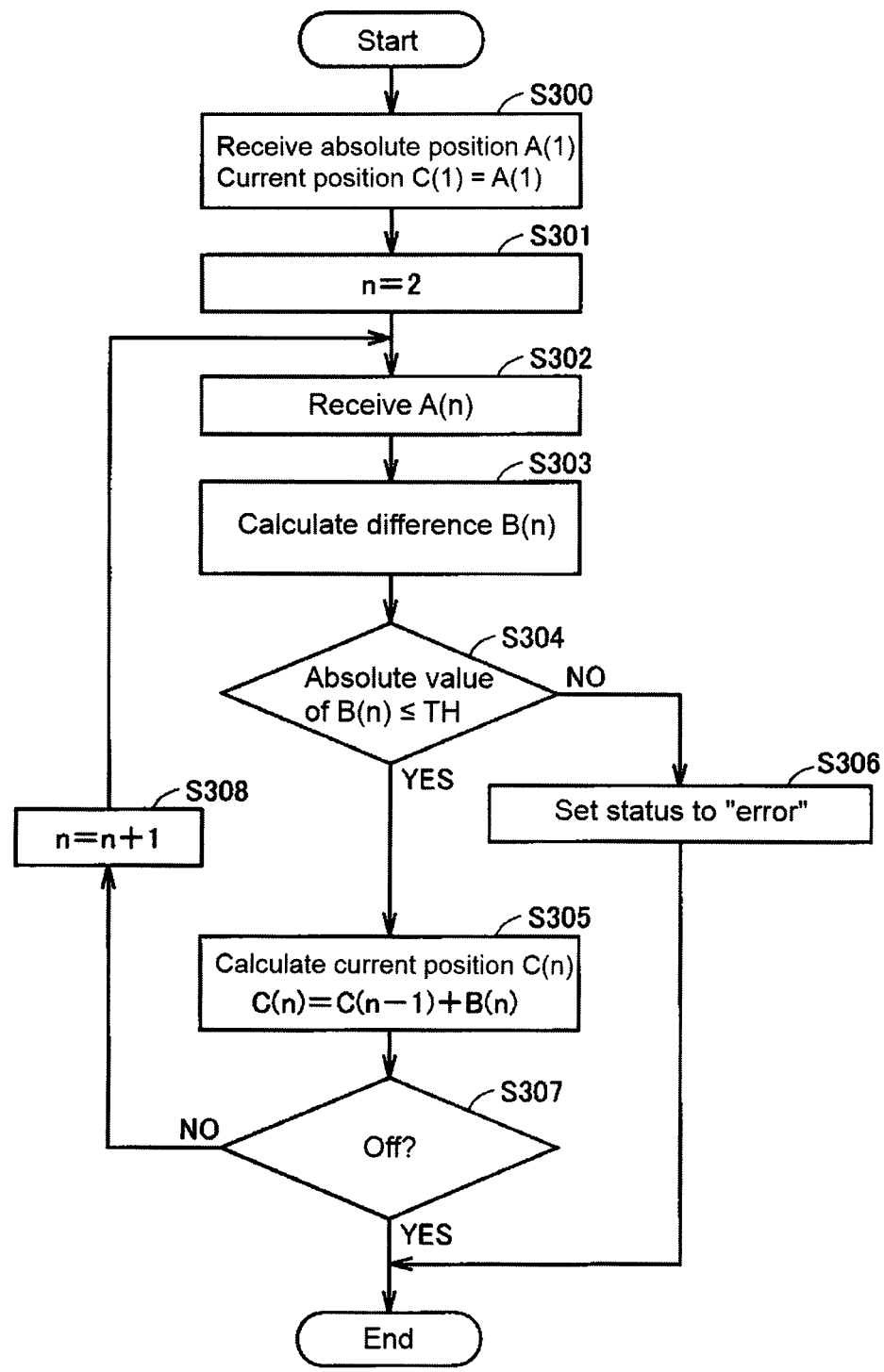
FIG. 11 is a flowchart illustrating a procedure for current position conversion according to example three.

FIG. 11 is a flowchart of a procedure for current position conversion according to example three.

Referring to FIG. 11, the serial data receiving unit 52 receives serial data sent from encoder 7B. An absolute position of encoder 7B that is represented by the first serial data received is denoted A(1). The position conversion unit 53 sets the value of the received absolute position A(1) as the value of a current position C(1) (step S300).

Next, "n" is set to 2 (step S301). Then, serial data receiving unit 52 receives serial data sent from encoder 7B. An absolute position of the encoder 7B that is represented by the received serial data is denoted by A(n) (step S302).

The position conversion unit 53 calculates the latest difference B(n) based on the most recently received absolute position A(n) and the absolute position A(n−1) that was received one point in time before the most recently received absolute position A(n). This is carried out via the method described above with reference to FIG. 4 (step S303).

If the absolute value of the difference B(n) is less than or equal to the threshold value TH (YES in step S304), then position conversion unit 53 calculates the latest current position C(n) by adding the difference B(n) to the current position C(n−1) that was calculated one point in time before the latest current position C(n) (step S305).

If the absolute value of the difference B(n) is greater than the threshold value TH (NO in step S304), then position conversion unit 53 sets the status to "error" (step S306), and ends the current position conversion.

Until power is turned off (YES in step S307), "n" is incremented (step S308), and processing from step S302 onward repeats.

As described above, according to this embodiment, as in the first and second examples, if the absolute position that was most recently received from the encoder 7B significantly differs from the absolute position that was received one point in time before the most recently received absolute position, then the most recently received absolute position contains an error, and anomaly avoidance processing is performed. This eliminates the need for a high-speed communication means and reduces computation load of the host device.

Example Four

In the first example, control unit 2 sends the threshold value TH for comparing differences between absolute positions. In that case, communication unit 3 receives and sends this threshold value TH to the SSI input unit 4C, and the position conversion unit 53 of the SSI input unit 4C executes the determination of step S104 on the basis of the received threshold value TH.

In contrast, in example four, the threshold value TH is stored in a nonvolatile memory included in the communication unit 3 or the SSI input unit 4C. The threshold value TH may be sent from control unit 2 and stored in the nonvolatile memory, or may be externally written to the nonvolatile memory via an USB (Universal Serial Bus).

When power to the motion control function module 8 is turned on or when the motion control function module 8 is restarted, position conversion unit 53 reads the threshold value TH stored in the nonvolatile memory and executes the determination of step S104 on the basis of the read threshold value TH.

The embodiments disclosed herein should be considered in all respects as illustrative and not restrictive. The scope of the invention is indicated by the appended claims rather than by the foregoing description, and all changes that come within the meaning and range of equivalency of the claims are therefore intended to be embraced therein.

The invention claimed is:

1. A synchronous serial interface circuit comprising:
   a clock output unit that outputs a synchronous clock signal;
   a receiving unit that receives data of an absolute encoder position, sent from the encoder in synchronization with the synchronous clock signal; and
   a position conversion unit that converts the received absolute encoder position into a current encoder position, wherein the position conversion unit calculates a difference between a last received absolute position and an absolute position received immediately prior to the last received absolute position, and obtains a last position by adding the difference and a current position that is calculated immediately prior to the latest current position, and if the absolute value of the calculated difference is greater than a threshold value, the position conversion unit determines that there is an error in the last received absolute position.

2. The synchronous serial interface circuit according to claim 1, wherein if the position conversion unit determines that there is an error in the most recently received absolute position, the position conversion unit sets the current position immediately prior to the last current position as the last current position.

3. The synchronous serial interface circuit according to claim 1, wherein if the position conversion unit determines that there is an error in the last received absolute position, then the position conversion unit sets the last current position by adding a difference that is calculated immediately prior to the current position to the position that is calculated immediately prior to the previous position.

4. The synchronous serial interface circuit according to claim 1, wherein if the position conversion unit determines an error in the last received absolute position, the position conversion unit stops conversion of the absolute position into the current position.

5. The synchronous serial interface circuit according to claim 1, wherein the encoder is a rotary encoder, if an absolute value of a subtracted value obtained by subtracting the absolute position received immediately before the last received absolute position from the last received absolute position is less than or equal to 180 degrees, then the position conversion unit uses the subtracted value as the difference, if the subtracted value is greater than 180 degrees, a value obtained by subtracting 360 degrees from the subtracted value is set as the difference, and if the subtracted value is smaller than −180 degrees, a value obtained by adding 360 degrees to the subtracted value is used as the difference.

6. A motion control function module comprising:

the synchronous serial interface circuit according to claim 1; and a communication unit that sends the latest current position calculated and a result of the error determination to an external controller at predetermined intervals.

7. The motion control function module according to claim 6, wherein the communication unit receives data representing the threshold value from the external controller, and the position conversion unit determines whether there is an error in the most recently received absolute position on the basis of the received threshold value.

8. The motion control function module according to claim 6, comprising:

a nonvolatile memory that stores the threshold value, wherein when power to the motion control function module is turned on or when the motion control function module is restarted, the position conversion unit reads the threshold value from the nonvolatile memory, and determines whether the last received absolute position has an error by a comparison of the threshold value.

\* \* \* \* \*